United States Patent [19]
Bauer

[11] Patent Number: 6,157,040
[45] Date of Patent: Dec. 5, 2000

[54] OPTOELECTRONIC SENSOR

[75] Inventor: Robert Bauer, Emmendingen, Germany

[73] Assignee: Sick AG, Waldkirch, Germany

[21] Appl. No.: 09/080,490

[22] Filed: May 18, 1998

[30] Foreign Application Priority Data

May 20, 1997 [DE] Germany .............. 197 21 105

[51] Int. Cl.[7] .................................................. G01N 21/00
[52] U.S. Cl. ...................................... 250/559.38; 250/221
[58] Field of Search ........................ 250/559.38, 559.29,
250/559.31, 221, 222.1; 356/3.01, 3.06,
375; 340/555, 556, 557

[56] References Cited

U.S. PATENT DOCUMENTS

| 4,274,735 | 6/1981 | Tamura et al. ................ 250/214 B |
| 4,490,037 | 12/1984 | Anagnostopoulos . |
| 4,575,237 | 3/1986 | Suzuki . |
| 4,693,598 | 9/1987 | Sehr . |
| 5,532,479 | 7/1996 | Jung . |

FOREIGN PATENT DOCUMENTS

| 3513671C2 | 2/1988 | Germany . |
| 4017485A1 | 12/1991 | Germany . |
| 4204013A1 | 8/1993 | Germany . |
| 29502329 | 5/1995 | Germany . |
| 4422497C2 | 6/1996 | Germany . |
| 4311691C2 | 7/1996 | Germany . |
| 19520242A1 | 12/1996 | Germany . |
| 19523843C1 | 1/1997 | Germany . |
| WO 90/02347 | 3/1990 | WIPO . |
| WO 93/00568 | 1/1993 | WIPO . |

*Primary Examiner*—Seungsook Ham
*Assistant Examiner*—Kevin Pyo
*Attorney, Agent, or Firm*—Townsend and Townsend and Crew LLP

[57] ABSTRACT

The invention relates to an optoelectronic sensor having a light transmitter for the transmission of a transmitted light beam into a monitored region, having a light receiver for the reception of a received light beam, which is formed by the transmitted light reflected in the direction of the light receiver from an article in the monitored region, wherein the received light beam stands at a variable beam angle to the transmitted light beam in dependence on the spacing of the article from the sensor, and having a control and evaluation unit for the processing of the output signal of the light receiver. The invention includes a light receiver that has a multi-element light sensor which has at least four individual sensor elements, which are arranged adjacently in such a way that different sensor elements are illuminated by the received light beam in dependence on the beam angle.

26 Claims, 5 Drawing Sheets

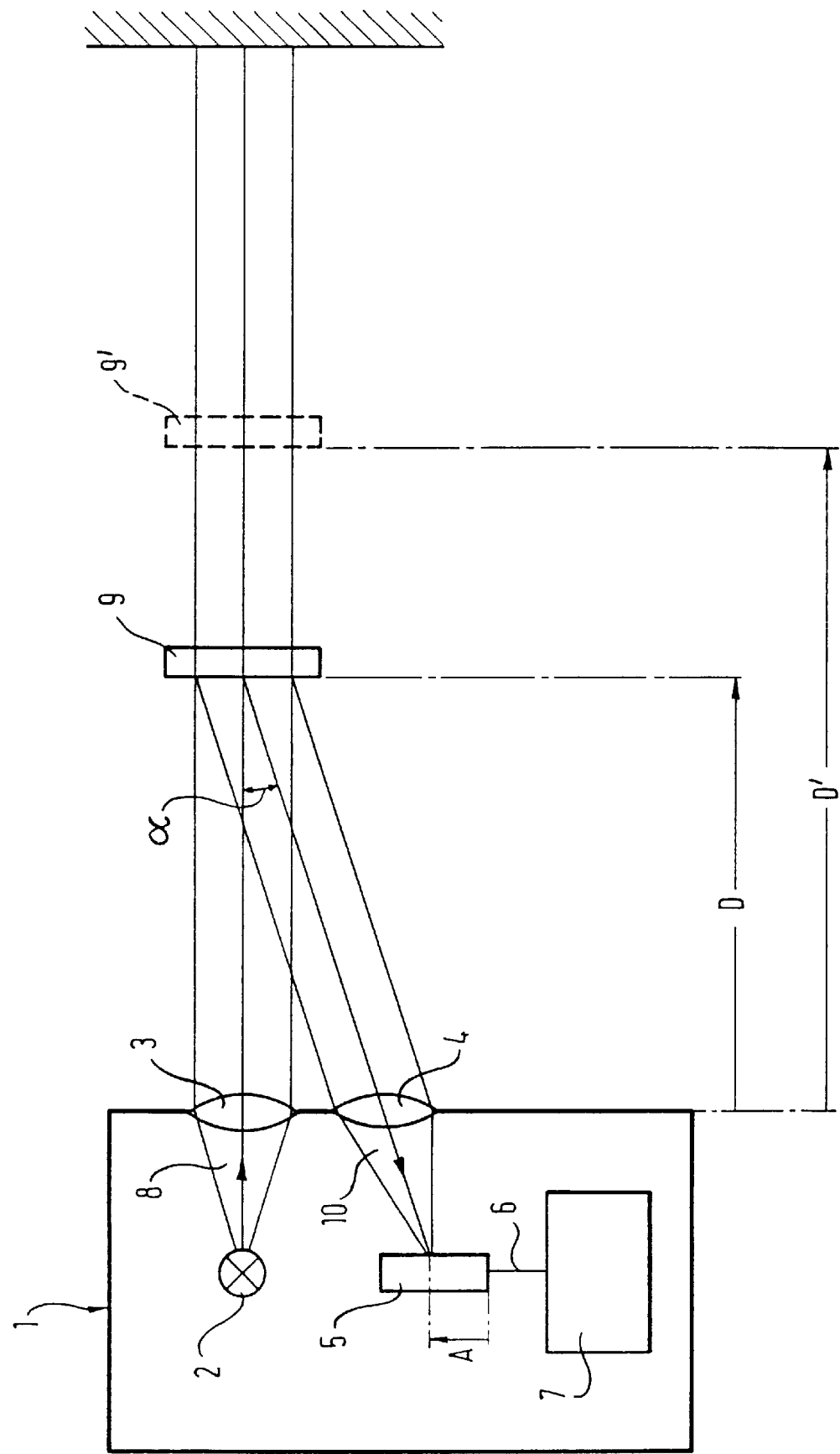

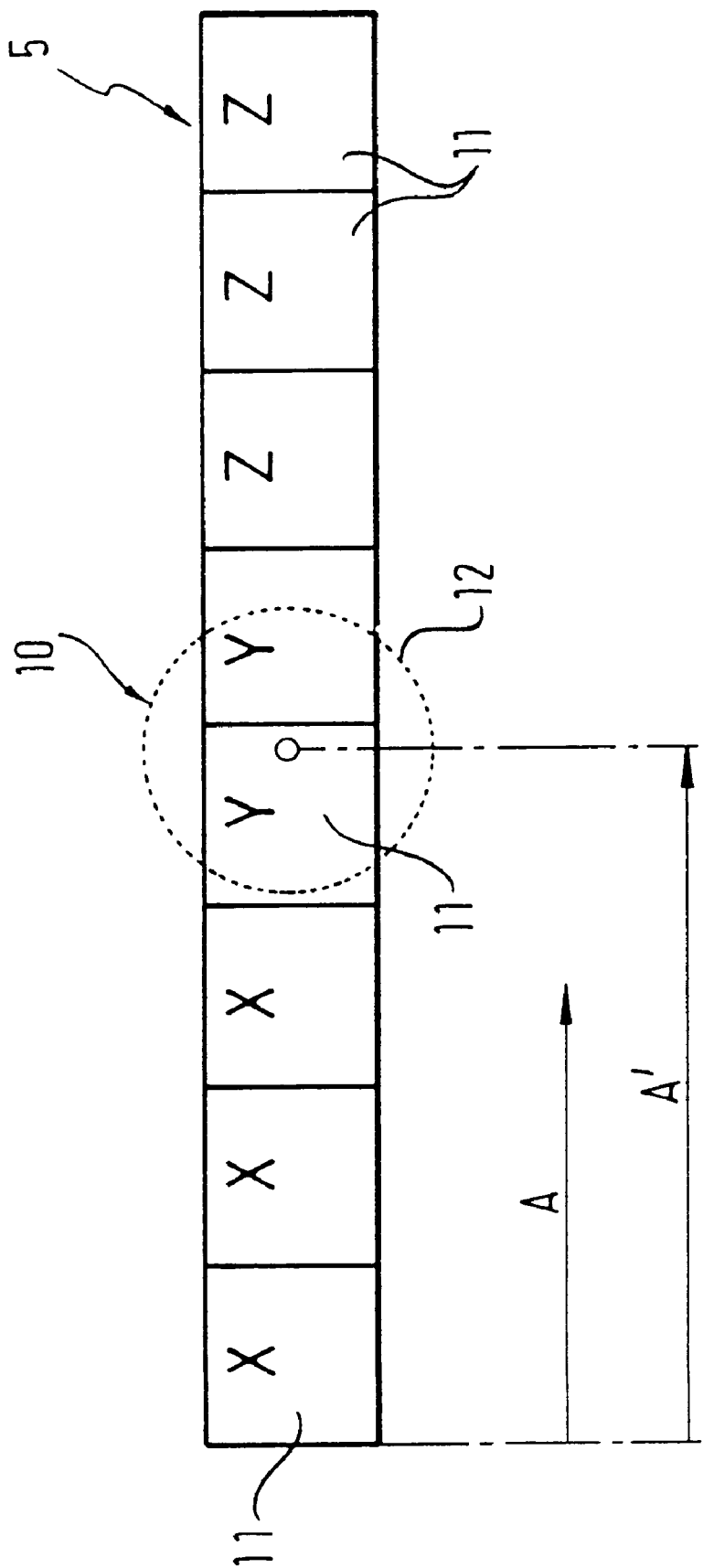

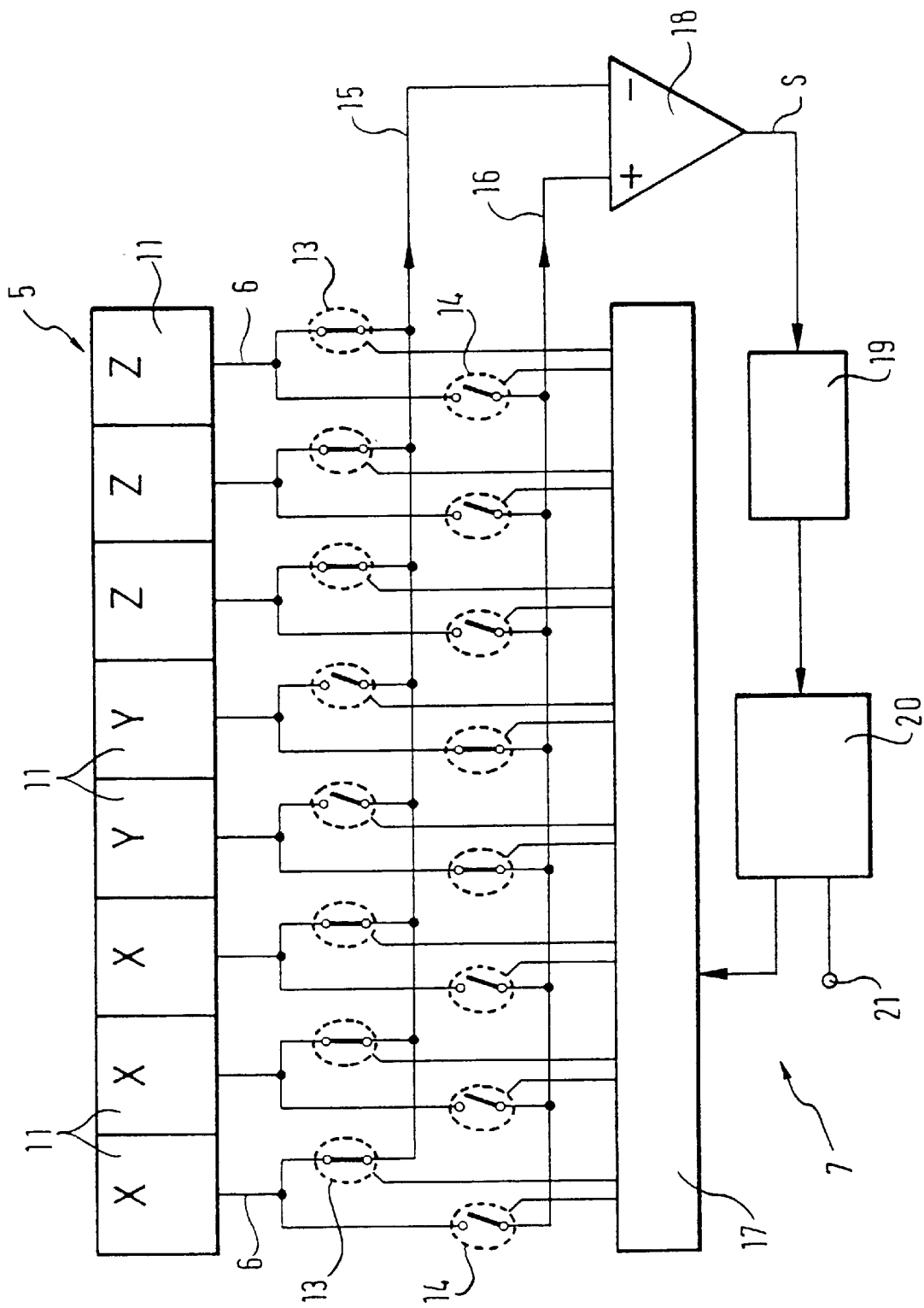

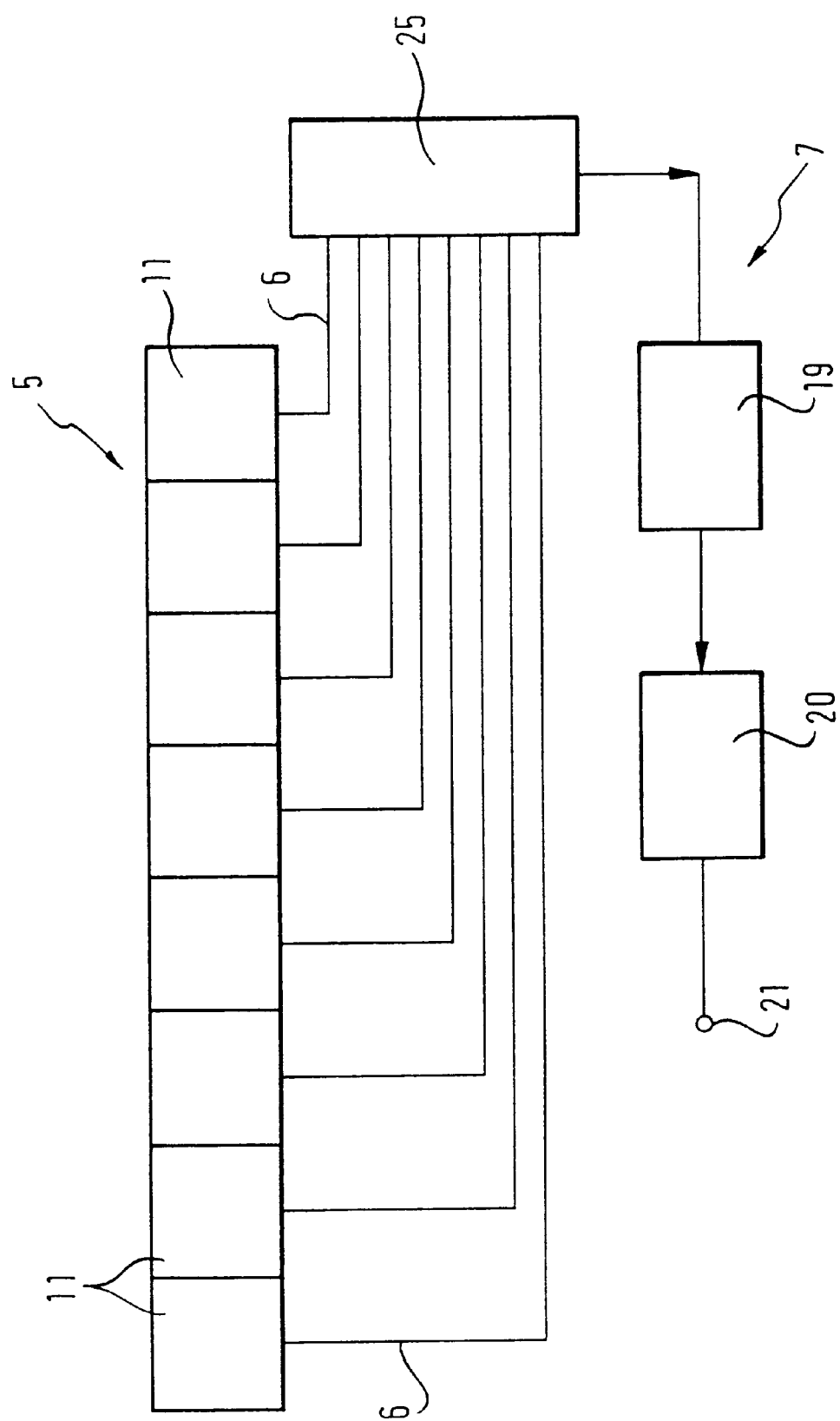

OPTOELECTRONIC SENSOR

FIELD OF THE INVENTION

The invention relates to an optoelectronic sensor having a light transmitter for the transmission of a transmitted light beam into a monitored region, having a light receiver for the reception of a received light beam, which is formed by the transmitted light reflected in the direction of the light receiver from an article in the monitored region, wherein the received light beam stands at a variable beam angle to the transmitted light beam, in dependence on the spacing of an article from the sensor, and having a control and evaluation unit for processing the output signal of the light receiver.

DESCRIPTION OF PRIOR ART

As a result of their sensitivity to the beam angle between the transmitted and received light beams, such sensors permit the determination of the spacing from the sensor of an article which reflects the transmitted light and/or the delimiting of the monitored region by the electronic blending out of articles in the foreground or background of the monitored region. Sensors which are formed to carry out this triangulation method are known in various embodiments.

Corresponding sensors have spatially resolving photoelements as light sensors, such as, for example, PSD diodes, which deliver two output signals from which the center of intensity of the received light beam illuminating the light sensor is found. Also known are difference elements which consist essentially of two adjacently disposed photodiodes. The spatial resolution of the received light beam illuminating the difference element takes place through comparison and evaluation of the respective output signals of the two photodiodes.

In order to adjust these sensors to a beam angle at which the received light beam does not illuminate the respective light sensor at its center, and at which the two output signals of the light sensor are thus not symmetrical, the symmetry of the illumination of the light sensor by the received light beam is normally produced by a mechanical adjustment device, in particular when using the difference elements. This mechanical adjustment device includes, for example, a deflecting mirror which is pivotable about a transverse axis. The use of a mechanical adjustment device results in disadvantageous manner in complicated manufacturing designwise, in a large volume construction and also in the sensor being subject to mechanical breakdown. Moreover, it requires a manual adjustment procedure to be carried out.

The known sensors of the initially named kind have, moreover, the disadvantage that the analogue formation of the center of illumination of their two output signals only enables an imprecise determination of the beam angle, and thus of the distance from the sensor of an article reflecting the transmitted light. Furthermore, their precision is undesirably and disadvantageously dependent on the location of the light sensitivity of the light sensor that is used.

OBJECT OF THE INVENTION

An object of the invention is to form a sensor of the initially named kind in such a way that it can be set to various reference distances of an article in the monitored range of the sensor with high precision and without the use of a mechanical adjustment device.

BRIEF DESCRIPTION OF THE INVENTION

A solution of this object in accordance with the invention consists wherein the light receiver of the sensor has a multi-element light sensor having at least four individual sensor elements which are arranged adjacently in such a way that different sensor elements are illuminated by the received light beam in dependence on the beam angle.

The light receiver of the sensor of the invention thus has at least four discrete sensor elements which can be individually read out and evaluated. In this way, the position, the structure and intensity of the received light beam which illuminates the light receiver can be determined with reference to the signals of the individual sensor elements. The plurality of output signals of the sensor of the invention enable a more precise evaluation than is the case when only two output signals are present. These essentially only deliver an analogue integral via the received light signal of the entire light sensitive surface of the light sensor. A subdivision of the light sensitive surface of the light sensor into a plurality of discrete sensor elements can thus help the sensor of the invention to achieve a higher spatial resolution.

A substantial advantage of the arrangement of the invention can also be seen in the fact that with a correspondingly large layout of the multi-element light sensor of the invention, with many individual sensor elements, a mechanical association or adjustment of the optical transmission system, a desired alignment or zero-point setting can be brought about by the variable association of the individual sensor elements to the control and evaluation unit.

Non-homogenous structures of the received light beam illuminating the multi-element light sensor can be resolved in accordance with the invention and evaluated in such a way that they can further increase the accuracy of the sensor. Disturbing effects, such as, for example, undesired reflections of the transmitted or received light beam can be recognized by the sensor, evaluated and filtered out. A specular reflection of the transmitted light at an article other than the article to be detected in the monitored region can, in particular, be recognized, as a result of the ability of the sensor to distinguish distances to the various reflecting articles, so that the false generation of an article detection signal can be suppressed.

The geometric extent along the surface of the multi-element light sensor of the received light beam reflected at an article in the monitored region can be found and can be used as further information for the determination of the distance of the article from the sensor.

As the signal information of the plurality of individual elements of the light sensor is available, this information can be processed with the aid of digital and electronic devices in a very diverse and flexible manner, which is respectively adapted to an individual application of the sensor. In this respect, evaluation programs which are stored and which can be called up can, in particular, be used. So-called "teach-in" methods can also enable the adaptation of the sensor to the requirements of an individual application an advantageously simple manner.

The setting of a beam angle corresponding to a specific reference distance can take place with the sensor of the invention by association of the maximum of the light intensity of the received light beam illuminating the multi-element light sensor to one or a plurality of individual sensor elements.

In this respect, it is, in particular, advantageous when the sensor elements of the multi-element light sensor can be subdivided by the control and evaluation unit into a plurality of sensor regions. In this way, these sensor regions can thereafter be distinguished as to whether they are illuminated by the received light beam reflected from an article in the monitored region. In this case, the sensor regions can correspond, in accordance with the respective beam angle, to different zones of the monitored region.

In preferred manner, the subdivision of the sensor elements takes place into two or three sensor regions in particular, in correspondence with a subdivision of the monitored region into two or three zones. These zones can then, for example, form an object zone and a foreground zone and a background zone respectively, in which articles bring about the production of an article detection signal or intentionally do not bring about the production of an article detection signal. This subdivision of the monitored region can, however, also take place into more than three zones in the same manner, as a result of the high spatial resolution of the sensor of the invention, for example, to form a further zone which is to be blended out within an object zone and in addition to a foreground zone and a background zone.

The subdivision of the sensor elements is preferably based on a calibration adjustment which is made once and which is matched to the particular application. For this purpose, a reference article can be located at a specific reference distance from the sensor within its monitored region. Thereafter, the corresponding signals of the sensor elements can be found and can be evaluated in such a way that the sensor elements are subdivided into sensor regions which precisely correspond to the reference distance of the reference article. In order to define a plurality of zones of the monitored region correspondingly differing reference distances can be measured by the sensor and can be evaluated in the above-described manner. The arrangement of the sensor elements in the multi-element light sensor can take place in a one-dimensional row.

It is preferred if the number of sensor elements is given by an integral power of the number 2 and in particular lies between 8 arid 1024. This simplifies the evaluation of the signals of the sensor elements, in particular with the aid of digital electronic means.

It is furthermore of advantage when the geometrical extent of the sensor element along at least one direction in the plane of its light sensitive surface is smaller, and in particular substantially smaller, than the geometrical extent of the received light beam along this direction FIG. 2. In this case, a plurality of sensor elements are illuminated by the received light beam and a higher resolution arises when determining the geometrical extent of the cross-section of the received light beam.

Furthermore, it is advantageous if the geometrical extent of the arrangement of a plurality of sensor elements along at least one direction in the plane of the light sensitive surface of the multi-element light sensor is greater than the geometrical extent of the received light beam along this direction FIG. 2. This prevents the light beam from simultaneously illuminating all sensor elements. Thus, a situation can also be achieved in which both a maximum signal corresponding to the highest light intensity of the received light beam, and also a minimal signal corresponding to the residual light and background noise, can be produced from different sensor elements of the multi-element light sensor, and in which the signal contrast of the multi-element light sensor is thus optimized. Moreover, this arrangement of the sensor elements favors their subdivision into different regions corresponding to their illumination by the received light beam.

The sensor of the invention can have a photodiode matrix as a multi-element light sensor, which is, in particular, formed in one piece. Such photodiode arrays, for example manufactured of silicon, normally form a cost-favorable detector with a plurality of discrete channels and they have a high ratio of light sensitive area to light insensitive area with a small volume construction.

It is furthermore of advantage if respective amplifier means is associated with the individual sensor elements of the multi-element Light sensor, with the amplification means, in particular, being arranged spatially close to the respective sensor element to avoid disturbing effects. One or more switches can also be associated with each sensor element by which the reading out of the signals of the sensor elements can be controlled. It is particularly advantageous when the amplification means and/or switches are integrated in the multi-element light sensor within a single chip.

The sensor of the invention functions particularly well if the control and evaluation unit contains means for the parallel readout of the signals of the sensor elements. If the sensor elements are subdivided into sensor regions, then it is of advantage if the control and evaluation unit includes means for the parallel readout of the signals of the sensor regions. Said means can be formed by a plurality of parallel lines, with the sensor elements of a sensor region, in particular, being associated with a parallel line.

The number of parallel lines can correspond to the number of sensor regions. By combining a plurality of sensor regions on a parallel line it can, however, also be smaller than the number of the sensor regions. The control and evaluation unit preferably has a switch control unit by which the switching of individual sensor elements onto a parallel line is controlled.

In an advantageous embodiment, a first switch and a second switch are respectively associated with each sensor element, with all the first switches being connected to a first parallel line and with all the second switches being connected to a second parallel line. In this case, a third switch can also be associated with each sensor element, with all the third switches being connected to a third parallel line. It is preferred when the sensor elements which are connected to one another through a parallel line via first, second or third switches each form a sensor region which represents the foreground, the object zone or the background of the monitored region.

Each sensor element is preferably only connected to one respective parallel line. A sensor element can, however, also be simultaneously connected to a plurality of parallel lines. This can, for example, be of advantage if this sensor element lies between the sensor elements of different sensor regions.

In a further preferred embodiment, the control and evaluation unit includes means for the serial readout of the signals of sensor elements. These means can be designed in such a way that, with subdivision of the sensor elements into sensor regions, they read out these sensor regions in series. The means can, in particular, be formed by a multiplex data transmission unit in which the signals of the sensor elements or the signals of the sensor elements of the sensor region, or the signals of the sensor regions are read in and transmitted one after the other time-wise.

The control and evaluation unit of the sensor of the invention can have means for the formation of the sum of the signals of sensor elements. In this way, an integrated signal can be produced over a specific region of the light sensitive surface of the multi-element light sensor, with this region being freely selectable in advantageous manner in accordance with a subdivision of the sensor elements into sensor regions. The sum formation can, for example, take place by switching the signals of the sensor elements of the sensor region onto a parallel line to which these sensor elements are jointly switched, or with the aid of a microprocessor.

It is of advantage if the control and evaluation unit has means for the formation of the difference between signals. These signals can either be output signals of the sensor elements or sums of signals from sensor elements, in particular of a sensor region. The contrast between the integral light signals of different sensor regions can, for example, be found with respect to these differences, with the sensor regions in turn being freely selectable in advantageous manner. In this case, it is preferred if the control and evaluation unit furthermore has means through which an article detection signal can be produced if the difference that has been found falls below or exceeds a defined threshold value, or is the same as the latter. The production of such an article detection signal can also take place if the difference that has been found lies within or outside of the tolerance range which surrounds a defined threshold value.

The manner of operation of the sensor of the invention is, moreover, favored if the control and evaluation unit includes means for the digitialization of the signals of the sensor element, or of the signals of the sensor elements of the sensor regions, if a subdivision of the sensor elements into sensor regions takes place. In this case, digital electronic evaluation means following the first said means can be used, for example, in order to analyze the position, width or structure of the received light beam which illuminates the multi-element light sensor.

The control and evaluation unit can contain a microprocessor. This can, for example, serve for the control of the parallel or serial readout of the signals of the sensor elements of the multi-element light sensor. In just the same way it can process and analyze the signals of the sensor elements. This microprocessor can also assess and specify the subdivision of the sensor elements into sensor regions, based on stored calculation bases. The microprocessor can, in particular, have a self-adaptive logic which enables an adaptation of the sensor, or of the sensor region subdivision, to varying evaluation and environmental conditions.

For the purpose of adjusting the sensor of the invention, it is advantageous if the control and evaluation unit has means for the manual and/or automatic calibration adjustment. This calibration adjustment can relate to a reference spacing from the sensor of a reference article located within the monitored region.

A manual calibration adjustment can, for example, also take place by external actuation of the means, in such a way that a desired output signal, or an article detection signal, is produced by the sensor when a reference article is present within the monitored region, at a reference distance from the sensor, with the desired output signal or article detection signal corresponding to this reference distance.

An automatic calibration setting can, for example, take place in that suitable signals of the sensor elements or sensor regions are found and stored. These signals can correspond to one or more reference spacing from the sensor, in each of which a reference article is arranged within the monitored region.

A subdivision of the sensor elements of the multi-element light sensor into a plurality of sensor regions can be individually specified in advantageous manner by means of a calibration adjustment, in particular by means of the automatic calibration adjustment.

The calibration adjustment preferably takes place once for the practical use of the sensor. The calibration adjustment can, however, also be repeated in practical use in order, if required, to bring about a change of the subdivision of the sensor elements into sensor regions matched to changed environmental conditions. Thus, for example, age dependent drift effects of the sensors can be compensated.

A further advantageous embodiment of the sensor of the invention enables, at least approximately, the quantitative determination of the distances from the sensor of articles located in the monitored region. This distance determination can take place with reference to the evaluation of the signals of the sensor elements. The control and evaluation unit of the sensor can have suitable means for this and for the outputting of the distances that have been found. The distance measurement can, in particular, be based on a calibration adjustment which includes the evaluation and storage of signals of the sensor elements which are found with the presence of reference articles at different distances from the sensor within the monitored region.

Finally, it is preferred if the light transmitter of the sensor is designed to transmit pulse-like light signals. In this case, it is of advantage if the multi-element light sensor and/or the control and evaluation unit are synchronized in suitable manner with the frequency of the pulse-like light signals.

BRIEF DESCRIPTION OF THE DRAWINGS

FIG. 1 is an illustration of the principle of a sensor in accordance with the invention, FIG. 2 is a schematic representation of a preferred arrangement of the sensor elements of a multi-element light sensor of the invention illuminated by a received light beam, FIG. 3 is an illustrational principle of a sensor in accordance with the invention with parallel readout of the sensor elements, FIG. 5 is an illustration of principle of a sensor in accordance with the invention with serial readout of the sensor elements.

DETAILED DESCRIPTION OF THE PREFERRED EXEMPLARY EMBODIMENTS

Figure 4A:
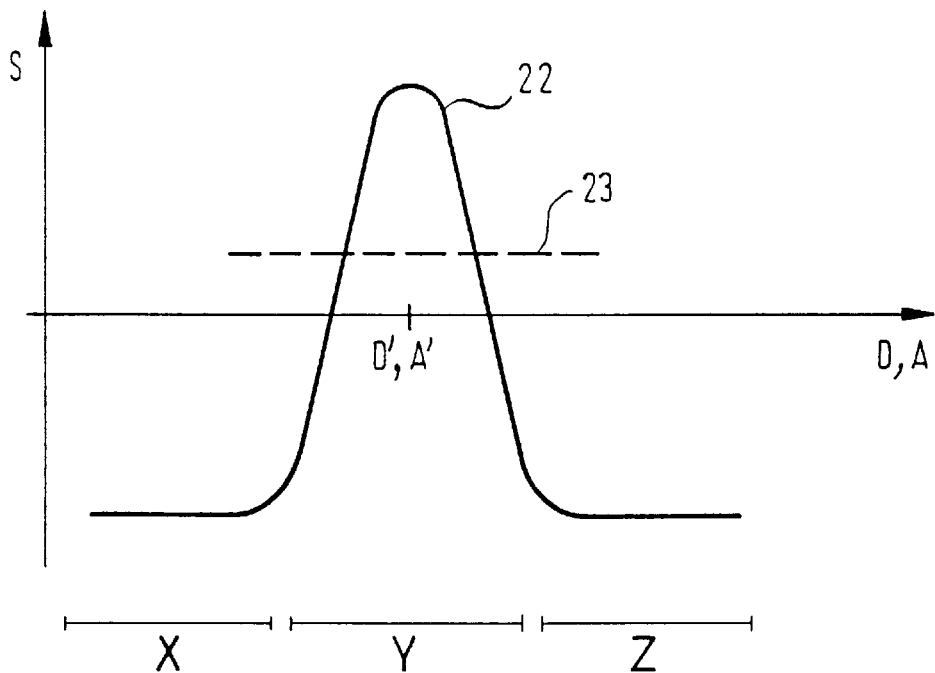
FIGS. 4a and 4b illustrate in each case the principal shape of the output signal of a means of the control and evaluation unit of the sensor of the invention, which processes the signals of the sensor elements.

FIG. 1 shows the schematic construction of an optoelectronic sensor 1. It contains a light transmitter 2, which is located essentially in the focal plane of an optical transmission system 3 arranged at the housing of the sensor 1. The housing of the sensor 1 furthermore has an optical receiving system 4 adjacent to the optical transmission system 3.

A light sensor 5 is located within the sensor 1, in the region of the image plane of the optical receiving system 4, in such a way that its light sensitive surface is arranged substantially parallel to the image plane of the optical receiving system 4, and in such a way that the center point of its light sensitive surface is laterally displaced from the main axis of the optical receiving system 4 away from the light transmitter 2. The light sensor 5 is connected to a control and evaluation unit 7 which is likewise located within the sensor 1 via a plurality of sensor signal outputs 6, of which only one is shown in FIG. 1.

Furthermore, a transmitted light beam 8 is drawn in in FIG. 1. The light beam 8 is transmitted from the light transmitter 2, passes through the optical transmission system 3 and has an approximately parallel course outside of the sensor 1.

An article 9 which reflects the light of the transmitted light beam 8 is located in the monitored region of the sensor 1 at a distance D from the sensor 1. The part of the reflected light which passes through the optical receiving system 4 into the interior of the sensor 1 onto the light sensor 5 forms the received light beam 10. The distance of the midpoint of the light bead which illuminates the light sensor 5, as measured form the end of the light sensor 5 remote from the light transmitter 2, is designated as the beam deflection A.

The transmitted light beam 8 and the received light beam 10 are essentially at a beam angle a to one another outside of the sensor 1.

Moreover, a further article is drawn in in broken lines in the monitored region of the sensor 1 in FIG. 1 and is arranged as a reference article 9' at a reference distance D' from the sensor 1. The light sensor 5 is made spatially resolving, i.e. its output signals deliver information concerning the region of its light sensitive surface in which it is illuminated by the received light beam. If the distance D of the article 9 from the sensor 1 changes, the beam angle a also changes and thus the beam deflection A as measured along the light sensitive surface of the light sensor 5.

The output signals of the light sensor 5 are supplied via the sensor signal outputs 6 to the control and evaluation unit 7. This is designed in such a way that it is able to associate different output signals of the light sensor 5 to different distances D of the article 9 from the sensor.

FIG. 2 shows, in a schematic illustration, the layout of a multi-element light sensor 5 in accordance with the invention. The multi-element light sensor 5 has eight sensor elements 11 arranged in a straight line adjacent to one another, two sensor elements 11 marked with the reference sign Y are at least partly illuminated by a received light beam 10. This received light beam has a circular cross-section 12. Its center point, as already described in connection with FIG. 1, is spaced by a beam deflection A from one end of the light sensor 5. The position of the center point of the cross-section 12 shown in FIG. 2 is especially characterized by a beam deflection A'.

The sensor elements 11 which are essentially not illuminated by the received light beam are designated in FIG. 2 on the one side relative to the received light beam by X and on the side of the multi-element light sensor 5 by Z. The designations X, Y and Z for the sensor element 11 correspond to a subdivision of the multi-element light sensor 5 into three different sensor regions.

Two possibilities of reading out the sensor elements 11 and of subdividing the multi-element light sensor 5 into sensor regions will be explained in the following by way of example and with reference to the FIGS. 3, 4 and 5. In doing so, the use of the multi-element light sensor 5 as a light sensor within the sensor 1 shown in FIG. 1 will be assumed.

FIG. 3 shows the multi-element light sensor 5 in accordance with FIG. 2 and also schematic components of a control and evaluation unit 7. Each sensor element 11 of the multi-element light sensor 5 has a sensor signal output 6 which is respectively electrically connected to one pole of a first switch 13 and to one pole of a second switch 14. The other respective pole of the first switch 13 is connected to a first parallel line 15 and the other respective pole of the second switch 14 is connected to a second parallel line 16. All switches 13, 14 are furthermore connected to a switch control unit 17.

The first parallel line 15 is supplied to the negative input and the second parallel line 16 to the positive input of the difference amplifier 18. The analogue output signal S of the difference amplifier 18 is supplied to an analogue/digital converter 19. The output of the A/D converter 19 and also the switch control unit 17 are connected to a microprocessor 20 which has an output 21.

Each signal output 6 of the sensor elements 11 is selectively switched by the switch control unit 17 by means of the switches 13, 14 to precisely one of the two parallel lines 15, 16. In this way, the signals of the sensor elements which are switched to one of the two parallel lines 15, 16 in each case are summed up to form a summed signal. As the multi-element light sensor 5 has three sensor regions which are shown in FIG. 3, in accordance with FIG. 2, by the marking of the sensor elements 11 with the designations X, Y and Z respectively, the output signals of the sensor elements of two different ones of the three sensor regions must be supplied to at least one of the two lines 15, 16.

In the position of the switches 13, 14 shown in FIG. 3, the signals of the sensor elements 11 of the sensor regions X and Z are supplied to the parallel line 15, and the signals of the sensor elements 11 of the sensor region Y are supplied to the parallel line 16.

The negative input of the difference amplifier 18 thus receives a signal which represents the sum of the signals of the sensor elements 11 of both the sensor region X and also the sensor region Z. In corresponding manner, a signal is supplied to the positive input of the difference amplifier 18 via the parallel line 16 and is formed from the sum of the signals of the sensor elements 11 of the sensor region Y.

If the multi-element light sensor 5 is illuminated by a received light beam 10, for example as shown in FIG. 2, essentially only in the sensor region Y, then the difference amplifier 18 delivers a positive output signal S to the A/D converter 19. After digitization by the A/D converter 19, this signal is further processed in the microprocessor 20, for example, in order to produce an article detection signal at its output 21 after comparison of the signal with the threshold value.

It is now possible to calibrate the sensor 1 shown in FIG. 3 in accordance with the arrangement of FIG. 1 to a reference spacing D' from the sensor 1 of articles within the monitored region. In this way, a foreground and a background to the monitored region are to be blended out in subsequent measurement in such a way that the sensor only reacts to articles within an object zone lying between them.

For this purpose, a reference article 9' is to be arranged in the monitored region at the desired reference distance from the sensor 1. If the reference article 9' reflects the transmitted light beam 8 as a received light beam 10, for example at a beam angle α, which results in the illumination of the multi-element light sensor with the received light beam 10 shown in FIG. 2, then precisely the subdivision of the sensor elements 11 of the multi-element light sensor 5 into the sensor regions X, Y and Z shown in FIGS. 2 and 3 is appropriate. This subdivision must therefore be recognized by the control and evaluation unit 7 and retained as the calibration setting.

For this purpose, the microprocessor 20 first finds the output signal of each sensor element 11 wherein it finds and evaluates the output signal of the difference amplifier 18 digitized by the A/D converter 19, with the different positions of the switches 13, 14 brought about via the switch control unit 17. After the evaluation has taken place, the microprocessor 20 instructs the switch control unit 17 to set the switches 13, 14 to precisely the positions which are shown in FIG. 3 and which correspond to the likewise shown subdivision of the sensor elements 11 into three sensor regions X, Y and Z for subsequent measurements. Thus, this subdivision of the multi-element light sensor 5 forms the calibration setting for the subsequent measurements.

If, in subsequent measurements, an article 9 lies within the monitored region at a reference spacing D', on which the calibration setting is based from the sensor 1, then the largest possible positive output signal S can be read off at the difference amplifier 18 as a consequence of the setting of the switches 13, 14 which has been effected. If an article 9 is in contrast located at a different distance D from the sensor 1 within the monitored region, then a beam angle α and a beam deflection A arise, which differ from the values on which the calibration setting of the sensor 1 is based. As the illumination of the multi-element light sensor 5, in this case, no longer takes place essentially in the sensor region Y, in contrast to the representation in FIG. 2, the difference amplifier 18 delivers a weaker positive or a negative output signal S, on the assumption that the position of the switches 13, 14 is retained.

The dependence of the output signal S of the difference amplifier 18 on the distance D from the sensor 1 of an article 9 located in the monitored region is given by the plot 22 shown in FIG. 4a for the position of the switches 13, 14 illustrated in FIG. 3. The fact that the output signal S delivers a maximum value if the article 9 is located at the reference spacing D', i.e. if the multi-element light sensor 5 is illuminated in the sensor region Y by the received light beam 10, can be deduced from this signal plot 22.

Furthermore, it can be seen from the signal plot 22 that the output of the difference amplifier 18 delivers negative values S if the multi-element light sensor 5 is illuminated by the received light beam clearly to one side of the reference beam deflection D'. To illustrate this relationship, the approximate position of the sensor regions X, Y and Z is indicated in FIG. 4a.

FIG. 4a makes it clear that the position of the switches 13, 14 on which the signal plot 22 is based, as shown in FIG. 3, can be used in a simple manner to electronically blend out the foreground and the background of the monitored region in accordance with the sensor regions X and Z respectively. For this purpose, the microprocessor 20, for example, only delivers an article detection signal at its output 21, if the output signal S of the difference amplifier 18 exceeds the threshold value 23 drawn in in FIG. 4a. Thus, only those articles which are located in an object zone of the monitored region corresponding to the sensor region Y can bring about the triggering of an article detection signal.

If the position of the switches 13, 14 shown in FIG. 3 is changed in such a way that the sensor elements 11 of the sensor regions X and Y are switched onto the first parallel line 15 and the sensor elements 11 of the sensor region Z are switched onto the second parallel line 16, then the sensor regions X and Y only form a single common sensor region. In this case, the sensor elements 11 of the multi-element light sensor 5 are only subdivided into two distinguishable sensor regions, namely the sensor regions X and Y and the sensor region Z.

Figure 4B:
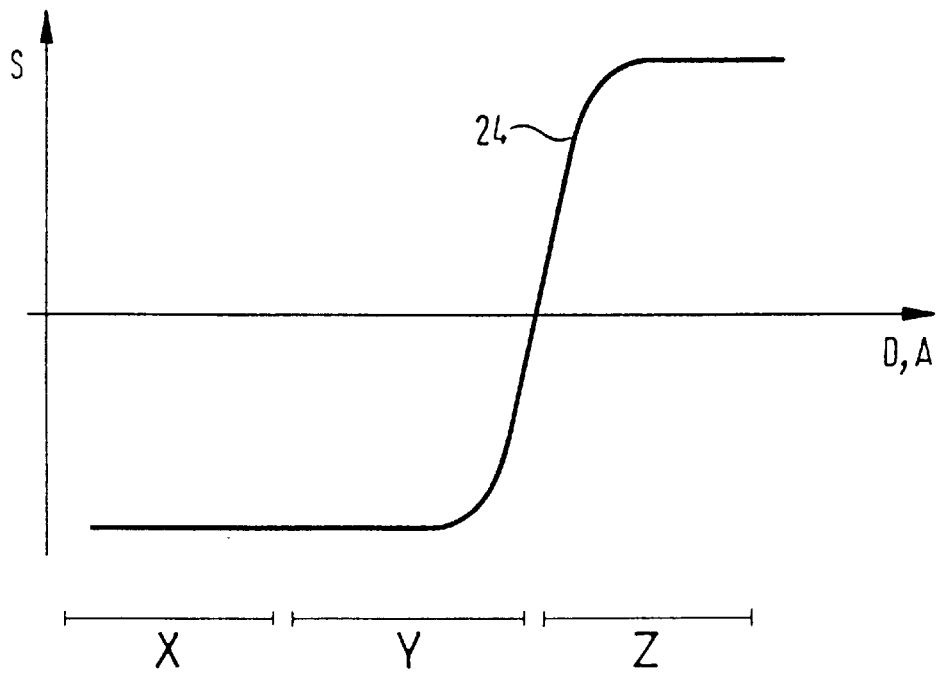

The dependence of the output signal S of the difference amplifier 18 on the distance D from the sensor 1 of an article 9 located in the monitored region corresponding to the above described switch position, or its dependence on the beam deflection A corresponding to the distance D, can be seen from the schematically illustrated plot 24 in FIG. 4b. As long as the beam deflection A lies substantially within the two sensor regions X and Y, the difference amplifier 18 delivers a negative output signal S. If, in contrast, the beam deflection A lies substantially within the sensor region Z, then the difference amplifier 18 delivers a positive output signal S. Thus, with this switch position, a zone, namely a foreground or a background of the monitored region, can be blended out in a very simple manner with reference to a comparison of the signal S with a threshold value.

The possibilities of blending out illustrated by the FIGS. 4a and 4b relate solely to instructions to the switch control unit 17 by the microprocessor 20. Various schemes and instructions to the switch control unit 17 can be stored in the microprocessor 20 and called up when required. Thus, the control and evaluation unit shown in FIG. 3 is extremely flexible with regard to the recognition of articles 9 and with regard to the electronic blending out of different zones within the monitored region. Through different calibrations, the sensor reacts to variable zones of the monitored region. A calibration matched to the special application can be carried out automatically and purely electronically without exerting a mechanical influence.

The arrangement of the control and evaluation unit 7 shown in FIG. 3 for the reading out of the sensor elements 11 and for their subdivision into various sensor regions can also take place in accordance with the layout schematically shown in FIG. 5. In this arrangement all sensor elements 11 of the multi-element light sensor 5 are connected via their sensor signal outputs 6 with the multiplex data transmission unit 25. The multiplex data transmission unit 25 is connected to an A/D converter 19, which is in turn connected to a microprocessor 20.

The signals applied to the sensor signal outputs 6 of the sensor elements 11 of the multi-element light sensor 5 are read in with a suitable frequency one at a time, time-wise one after the other, by the multiplex data transmission unit 25 and are passed on to the A/D converter 19. This digitizes each of the signals and passes them on in digitized form to the microprocessor 20.

Thus, after full readout of all the sensor elements, the microprocessor 20 has its signals individually available, without a summation of different signals similar to the way described in connection with FIG. 3 having taken place at this time. The microprocessor 20 can now evaluate the signals either individually or collectively.

The evaluation of the individual signals by the microprocessor is, in particular, sensible when a calibration adjustment of the sensor 1 is to be carried out. Then the evaluation can take place, similar to the way described in connection with FIG. 3, in such a way that a subdivision of the sensor elements 11 into different sensor regions is present as a result. In this arrangement, the sensor regions again correspond to zones within the monitored region in which articles can be detected or intentionally not detected.

A collective evaluation of the signals of the sensor elements in the microprocessor 20 then takes place, in particular, when a subdivision of the sensor elements 11 into sensor regions corresponding to zones of the monitored region has already been carried out. In this case, the signals of the sensor elements 11 of the sensor regions can, for example, be added up in similar manner to that described in connection with FIG. 3 so that the differences between the resulting summed values can be formed and can be compared with threshold values. Thus, the microprocessor can deliver a signal at its output 21, which relates to a statement as to whether an article is located in the monitored region of the sensor 1, or to a statement of the zone of the monitored region in which this article is located.

In each case the microprocessor 20 is in turn extremely flexible in the evaluation of the signals. It is thus provided in a simple manner with a self-adapting logic, which, for example, assists an automatic calibration setting and is able to recognize slow changes of the signals time-wise which relate to undesired effects.

What is claimed is:

1. An optoelectronic sensor having a light transmitter for the transmission of a transmitted light beam into a monitored region, having a light receiver for the reception of a received light beam, which is formed by the transmitted light reflected in the direction of the light receiver from an article in the monitored region, wherein the received light beam stands at a variable beam angle to the transmitted light beam, in dependence on the spacing of an article from the sensor, and having a control and evaluation unit for processing the output signal of the light receiver, wherein the light receiver has a multi-element light sensor having at least four individual sensor elements which are arranged adjacent to one another in such a way that different sensor elements are illuminated by the received light beam in dependence on the beam angle, wherein the control and evaluation unit comprises means by which the sensor elements of the multi-element light sensor can be subdivided in a variable manner into a plurality of sensor regions, wherein the sensor regions correspond to different zones of the monitored region, wherein each of the sensor elements is associated with one of the sensor regions, wherein the control and evaluation unit may be brought into a calibration operation in which the subdivision of the sensor elements into sensor regions is performed, wherein the control and evaluation unit may be brought into a monitoring operation in which the subdivision of the sensor elements into sensor regions is maintained, wherein during the monitoring operation at least one sensor region is electronically blended out from monitoring, and wherein the control and evaluation unit comprises monitoring means for producing an article detection signal only when an article is detected within a zone of the monitored region corresponding to a sensor region which is not blended out.

2. A sensor in accordance with claim 1, wherein the sensor elements of the multi-element light sensor can be subdivided in a variable manner into two or three sensor regions.

3. A sensor in accordance with claim 1, wherein the multi-element light sensor has a unidimensional arrangement of sensor elements.

4. A sensor in accordance with claim 1, wherein the number of the sensor elements is an integral power of the number two.

5. A sensor in accordance with claim 1, wherein the geometrical extent of a sensor element along at least one direction in the plane of its light sensitive surface is smaller than the geometrical extent of the received light beam along this direction.

6. A sensor in accordance with claim 1, wherein the geometrical extent of the arrangement of sensor elements along at least one direction in the plane of the light sensitive surface of the multi-element light sensor is larger than the geometrical extent of the received light beam along this direction.

7. A sensor in accordance with claim 1, wherein the multi-element light sensor has a photodiode matrix in one piece.

8. A sensor in accordance with claim 1, wherein the sensor contains amplifiers or switches respectively associated with the individual sensor elements, which are integrated into the multi-element light sensor.

9. A sensor in accordance with claim 1, wherein the control and evaluation unit includes means for a parallel reading out of the signals of sensor elements subdivided into sensor regions.

10. A sensor in accordance with claim 1, wherein several switches are associated with each sensor element, with the switches each being connected to one of several parallel lines, wherein each of the switches associated with one sensor element is connected to a different parallel line.

11. A sensor in accordance with claim 10, wherein a first and a second switch is associated with each sensor element, with all the first switches being connected to a first parallel line and all second switches being connected to a second parallel line.

12. A sensor in accordance with claim 11, wherein the sensor elements, which are connected via first or second switches each form a sensor region.

13. A sensor in accordance with claim 1, wherein the control and evaluation unit includes means for a serial readout of the signals of sensor elements.

14. A sensor in accordance with claim 1, wherein the control and evaluation unit has summing means for forming a sum of signals of sensor elements, with the forming of the sum of signals taking place over signals of the sensor elements of one or more sensor regions.

15. A sensor in accordance with claim 1, wherein the control and evaluation unit includes means for forming a difference between signals of sensor elements or between sums of signals of sensor elements.

16. A sensor in accordance with claim 1, wherein the control and evaluation unit has comparison means for producing an article recognition signal when the difference between respective sums of signals of sensor elements associated with one or more sensor regions falls short of or equals or exceeds a defined threshold value.

17. A sensor in accordance with claim 1, wherein the control and evaluation unit has comparison means for producing an article detection signal when the difference between respective sums of signals of sensor elements associated with one or more sensor regions lies within or outside of a tolerance range surrounding a defined threshold value.

18. A sensor in accordance with claim 1, wherein the control and evaluation unit includes means for a digitization of the signals of sensor elements or of a sum or a difference of signals of sensor elements.

19. A sensor in accordance with claim 1, wherein the control and evaluation unit includes a microprocessor for the control of a parallel or serial readout of the signals of the sensor elements or for changing the subdivision of the sensor elements into the sensor regions.

20. A sensor in accordance with claim 1, wherein the control and evaluation unit has calibration means for a manual or automatic calibration setting of the sensor when a reference article is located in a reference spacing within the monitored region, wherein the subdivision of the sensor elements of the multi-element light sensor into a plurality of sensor regions is brought about by this calibration setting.

21. A sensor in accordance with claim 1, wherein the control and evaluation unit includes adaption means be which a threshold value is raised or lowered or by which the subdivision of the sensor elements of the multi-element light sensor into sensor regions is changed when a slow time-wise change of the signals of sensor elements of different sensor regions of the multi-element light sensor is detected despite a constant reference spacing from the sensor of articles located within the monitored region.

22. A sensor in accordance with claim 1, wherein the light transmitter is formed for the transmission of pulse-like light signals.

23. A sensor in accordance with claim 14, wherein said summing means are formed by a microprocessor or by an analog circuit in which the signals of the sensor elements of a sensor region are switched onto a common parallel line.

24. A sensor in accordance with claim 9 wherein the means for a parallel reading are formed by one of a plurality of parallel lines or a switch control unit.

25. A sensor in accordance with claim 13 wherein the means for a serial readout of the signals of sensor elements is a multiplex data transmission unit.

26. A sensor in accordance with claim 14 wherein the summing means are formed by one of a microprocessor or an analog circuit in which the signals of the sensor elements of a sensor region are switched onto a common parallel line.

* * * * *